(12) United States Patent
Li et al.

(10) Patent No.: US 10,966,118 B2
(45) Date of Patent: Mar. 30, 2021

(54) CHANNEL ENCODING METHOD AND COMMUNICATION DEVICE

(71) Applicant: HUAWEI TECHNOLOGIES CO., LTD., Guangdong (CN)

(72) Inventors: Rong Li, Hangzhou (CN); Yunfei Qiao, Hangzhou (CN); Huazi Zhang, Hangzhou (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 155 days.

(21) Appl. No.: 16/352,796

(22) Filed: Mar. 13, 2019

(65) Prior Publication Data
US 2019/0215720 A1 Jul. 11, 2019

Related U.S. Application Data

(63) Continuation of application No. PCT/CN2017/096654, filed on Aug. 9, 2017.

(30) Foreign Application Priority Data

Sep. 14, 2016 (CN) .......................... 201610825091.1

(51) Int. Cl.
H04W 28/06 (2009.01)
H03M 13/13 (2006.01)
(Continued)

(52) U.S. Cl.
CPC ........... *H04W 28/06* (2013.01); *H03M 13/09* (2013.01); *H03M 13/13* (2013.01); *H04L 1/00* (2013.01);
(Continued)

(58) Field of Classification Search
CPC .... H04W 28/06; H04W 72/046; H04L 1/001; H04L 1/00; H04L 1/0009; H04L 69/22;
(Continued)

(56) References Cited

U.S. PATENT DOCUMENTS

2005/0058229 A1 3/2005 Alagha
2015/0333769 A1* 11/2015 Jeong .................... H03M 13/13
714/790
(Continued)

FOREIGN PATENT DOCUMENTS

CN 102164025 A 8/2011
CN 102299735 A 12/2011
(Continued)

OTHER PUBLICATIONS

Huawei et al.,"Polar code design and rate matching",3GPP TSG RAN WG1 Meeting #86 R1-167209,Gothenburg, Sweden, Aug. 22-26, 2016,total 5 pages.
(Continued)

*Primary Examiner* — Kiet Tang
(74) *Attorney, Agent, or Firm* — Huawei Technologies Co., Ltd.

(57) ABSTRACT

Embodiments of this application provide a channel encoding method for use by a communication device. The communication device obtains a quantity K of information bits, and determines a load size of a channel for transmitting the K information bits. The load size of the channel is N bits, where N≥K, N=2$^n$, and n is a positive integer. The communication device performs a polar encoding process on the K information bits, to obtain a polar code sequence that includes N bits. The N-bit polar code sequence is transmitted using the channel, without rate matching. Because a quantity of coded bits obtained after the polar encoding is equal to a load size of a channel, no rate matching process is required. This reduces encoding overheads of a channel. Complexity and latency of channel encoding are greatly reduced, and performance loss associated with the rate matching operation is avoided.

17 Claims, 5 Drawing Sheets

(51) Int. Cl.
*H04L 1/00* (2006.01)
*H03M 13/09* (2006.01)
*H04L 29/06* (2006.01)
*H04W 72/04* (2009.01)

(52) U.S. Cl.
CPC ............ *H04L 1/001* (2013.01); *H04L 1/0009* (2013.01); *H04L 69/22* (2013.01); *H04W 72/046* (2013.01)

(58) Field of Classification Search
CPC ..... H04L 1/0027; H04L 1/003; H04L 1/0057; H04L 1/0058; H04L 1/0056; H03M 13/09; H03M 13/13; H04B 7/0456; H04B 7/0469
See application file for complete search history.

(56) References Cited

U.S. PATENT DOCUMENTS

| | | |
|---|---|---|
| 2015/0349916 A1 | 12/2015 | Murakami et al. |
| 2016/0056843 A1 | 2/2016 | Gross et al. |
| 2016/0182187 A1* | 6/2016 | Kim ................... H04L 1/1861 714/807 |
| 2016/0352464 A1 | 12/2016 | Shen et al. |
| 2017/0019214 A1 | 1/2017 | Shen et al. |
| 2017/0047947 A1* | 2/2017 | Hong ................ H03M 13/2906 |

FOREIGN PATENT DOCUMENTS

| | | |
|---|---|---|
| CN | 105141322 A | 12/2015 |
| CN | 105164959 A | 12/2015 |
| CN | 105900365 A | 8/2016 |
| EP | 3496311 A1 | 6/2019 |
| WO | 2015123855 A1 | 8/2015 |

OTHER PUBLICATIONS

3GPP TS 36.211 V13.2.0 (Jun. 2016),3rd Generation Partnership Project;Technical Specification Group Radio Access Network;Evolved Universal Terrestrial Radio Access (E-UTRA);Physical channels and modulation(Release 13),dated Jun. 2016,total 168 pages.

Huawei et al.,"Overview of Polar Codes",3GPP TSG RAN WG1 Meeting #84bis R1-162161,Busan, Korea, Apr. 11-15, 2016,total 7 pages.

Huawei et al.,"Polar codes—encoding and decoding",3GPP TSG RAN WG1 Meeting #xx R1-164039,Nanjing, China, May 23-27, 2016,total 7 pages.

* cited by examiner

CHANNEL ENCODING METHOD AND COMMUNICATION DEVICE

CROSS-REFERENCE TO RELATED APPLICATIONS

This application is a continuation of International Application No. PCT/CN2017/096654, filed on Aug. 9, 2017, which claims priority to Chinese Patent Application No. 201610825091.1, filed on Sep. 14, 2016. The disclosures of the aforementioned applications are hereby incorporated by reference in their entireties.

TECHNICAL FIELD

This application relates to the communications field, and in particular, to an information transmission method, a transmit-end device, and a receive-end device.

BACKGROUND

With rapid evolution of wireless communications, future 5th generation (5G) communication systems will display some new characteristics. Three typical communications scenarios under 5G are enhanced mobile bandwidth (eMBB), massive machine type communications (mMTC), and ultra-reliable and low latency communications (URLLC). Requirements of these communications scenarios impose new challenges to the existing Long Term Evolution (LTE) technology. Communication systems usually use channel encoding to improve data transmission reliability and ensure communication quality. As a most basic radio access technology, channel encoding is one of important research objects that are aimed to meet 5G communication requirements.

After the Shannon theory is proposed, scholars in many countries are concentrating on seeking for an encoding/decoding method that can reach the Shannon limit while having relatively low complexity. Although a Turbo code, which is in a mainstream research direction, and a low-density parity-check (LDPC) code, which has been re-proposed, have been well applied to LTE systems and Worldwide Interoperability for Microwave Access (WiMAX) systems, the two coding schemes cannot well resolve some important issues in the 5G communication systems. For example, eMBB and mMTC require future channel encoding schemes to support a wider range of bit rates with relatively low complexity. In addition, eMBB and mMTC differ from LTE in an important characteristic that is medium and short packet transmissions, and therefore require channel encoding to better support communication of such code lengths. URLLC imposes an even stricter requirement on data transmission reliability. In terms of bit rate, the Turbo code in the existing LTE systems cannot support extremely low or extremely high bit rates. For medium and short packet transmissions, due to encoding and decoding characteristics of the Turbo code and the LDPC code, it is quite difficult for the Turbo code and the LDPC code to achieve ideal performance with a limited code length. For a long packet, the Turbo code and the LDPC code can approach the Shannon limit as the code length is getting longer, but still cannot achieve the ideal performance. In addition, in practical applications, the Turbo code and the LDPC code have relatively high complexity in encoding/decoding implementation processes. Therefore, in 5G communication systems, a new encoding technology is urgently needed to resolve issues in the existing technology regarding medium or short packets, bit rate, reliability, and complexity.

Recently, based on channel polarization, Professor Ankan of Turkey has proposed an encoding scheme named "polar code." The polar code is the first and the only channel encoding method that can be strictly proven to "reach" a channel capacity. For different code lengths, and in particular, for a limited code length, performance of the polar code is far superior to that of the Turbo code and the LDPC code. In addition, the polar code has relatively low computing complexity in encoding/decoding. These advantages make the polar code the one that has great development and application potential in 5G.

The polar code is an encoding scheme that can reach the Shannon capacity while having low encoding/decoding complexity. The polar code is a linear block code with a generator matrix $G_N$. An polar encoding process is:

$$x_1^N = u_1^N G_N,$$

where $u_1^N = (u_1, u_2, \ldots, u_N)$ is a binary row vector, N is a code length and is equal to $2^n$, and $n \geq 0$.

The generator matrix $G_N$ is a matrix of N rows×N columns $$G_N = B_N F_2^{\otimes(\log 2(N))}$$

where $$F_2 = \begin{bmatrix} 1 & 0 \\ 1 & 1 \end{bmatrix},$$

and $B_N$ is an N×N transposed matrix, such as a bit reversal matrix. $F_2^{\otimes(\log 2(N))}$ is a Kronecker power of $F_2$ and is defined as $$F^{\otimes(\log 2(N))} = F \otimes F^{\otimes(\log 2(N)-1)}$$

Specifically, the polar code is a channel dependent coding scheme. A polarization processing is performed on N identical channels W, to obtain N polarized channels. Certainly, Bhattacharyya parameters of the N polarized channels approach 0 or 1. During actual application of the polar code, an important task is to calculate, for different channels W, reliabilities of all N ($N=2^n$) polarized channels, and then select K polarized channels with higher reliabilities. A set of location index numbers that correspond to the K polarized channels is referred to as an information set A. Remaining bits are set to a fixed value that is pre-agreed on by a transmit end and a receive end, and are referred to as fixed bits. A set of location index numbers that correspond to the fixed bits is denoted by $A^c$, that is, a complementary set of A. During polar encoding, K information symbols are put at corresponding bit locations in the information set, and known fixed symbols are put at remaining (N−K) bit locations (referred to as a frozen set). Generally, the (N−K) known fixed symbols may be all 0 symbols, where K≤N. Actually, the fixed bits may be set arbitrarily, provided that a pre-agreement is made between the transmit end and the receive end. Therefore, a coded bit sequence based on the polar code may be obtained by using the following method:

$$x_1^N = u_A G_N(A)$$

where $u_A$ is an information bit set in $u_1^N$, and $u_A$ is a row vector with a length K, that is, |A|=K, where |•| represents a quantity of elements in a set. In other words, K represents not only a quantity of elements in the set A, but also a quantity of to-be-encoded information bits. $G_N(A)$ is a sub-matrix including rows in the matrix $G_N$ that are corresponding to indexes in the set A, and $G_N(A)$ is a K×N matrix. The set A determines performance of the polar code.

When the polar code is used for channel encoding, after to-be-transmitted data is encoded, processes such as rate matching usually need to be performed based on load capacity of a current channel. The processes are relatively complex. Therefore, how to reduce information transmission complexity becomes an issue that urgently needs to be resolved.

SUMMARY

Embodiments of this application provide an information transmission method, a transmit-end device, and a receive-end device. According to the method, information transmission complexity can be reduced.

According to a first aspect, an information transmission method is provided, where the method includes:

determining a mother code length N of a polar code sequence based on a load size of a first channel, where the load size of the first channel is N bits, N is $2^n$, and n is a positive integer;

performing polar encoding on target information that needs to be transmitted, to obtain N coded bits; and transmitting the N coded bits by using the first channel.

Therefore, in this embodiment of this application, because a quantity of coded bits obtained after polar encoding is equal to a load size of a channel, no rate matching process is required when the N coded bits are transmitted by using the first channel. This reduces encoding overheads of a channel, and further reduces information transmission complexity.

It should be understood that a load size of a channel in this embodiment of this application may be a code length of an actually transmitted polar code, that is, a quantity of actually transmitted bits. In other words, the load size of the channel corresponds to a transport block (TB) size of the polar code.

Optionally, the target information is control information, and the first channel is a control channel.

It should be understood that the target information may alternatively be other information, for example, broadcast information, data information, acknowledgment information, or feedback information. Correspondingly, the first channel may be another channel, for example, a broadcast channel or a data channel. This is not limited in this embodiment of this application.

Optionally, in another embodiment, the load size of the control channel corresponds to a format of the control channel. The format of the control channel is one of a plurality of preset channel formats. Each of the plurality of channel formats corresponds to one channel load size. Each of a plurality of load sizes corresponding to the plurality of channel formats is a positive integer power of 2.

For example, when the control information is downlink control information (DCI) and the control channel is a physical downlink control channel (PDCCH), the N bits may correspond to a format of the current channel. To be specific, a network device may determine a PDCCH format based on a channel status, determine a load size N corresponding to the format, and then perform polar encoding on the DCI to obtain N coded bits corresponding to the load size of the channel.

For example, the plurality of preset channel formats may be PDCCH formats 0 to 3. The network device may determine a PDCCH format for current to-be-transmitted DCI based on a current channel status, for example, channel quality and/or a channel congestion status. In this case, an aggregation level and a load size of a channel are also determined for transmitting the DCI. Because the load size N is equal to $2^n$, N may be used as a mother code length of a polar code sequence, and then polar encoding is performed on the DCI to obtain N coded bits. Because the load size of the PDCCH is also N bits, the N coded bits can be transmitted by using the PDCCH without rate matching.

In this embodiment of this application, different aggregation levels are set for different PDCCH formats. The following provides descriptions by using an example. For example, in this embodiment of this application, for different aggregation levels, an aggregation resource occupied by a channel may include one control channel element (CCE) or a plurality of consecutive CCEs in first one to three orthogonal frequency division multiplexing OFDM symbols of a subframe. A CCE in the PDCCH (that is, a CCE occupied by the PDCCH) includes $2^x$ resource element groups (REG), where x is a positive integer.

Specifically, when a format of the PDCCH is m, an aggregation level is $2^m$, and a time-frequency resource occupied by the PDCCH is $2^m$ control channel elements CCEs, where m=0, 1, 2, 3 . . . ; each CCE includes $2^x$ resource element groups REGs, where x is a positive integer; and each REG includes four resource elements (RE).

For example, when a format of the PDCCH is 0, an aggregation level is 1, and a time-frequency resource occupied by the PDCCH is one control channel element CCE. When a format of the PDCCH is 1, an aggregation level is 2, and a time-frequency resource occupied by the PDCCH is two CCEs. When a format of the PDCCH is 2, an aggregation level is 4, and a time-frequency resource occupied by the PDCCH is four CCEs. When a format of the PDCCH is 3, an aggregation level is 8, and a time-frequency resource occupied by the PDCCH is eight CCEs. When a format of the PDCCH is 4, an aggregation level is 16, and a time-frequency resource occupied by the PDCCH is 16 CCEs.

For example, each CCE includes 2, 4, 8, or 16 REGs, provided that a quantity of resource element groups REGs included in the CCE is a positive integer power of 2. This is not limited in this embodiment of this application.

A load size for each PDCCH format is described by using an example in which each CCE includes eight REGs.

Specifically, when the format of the PDCCH is m, a load size of the PDCCH may be $64*2^m$ bits, $128*2^m$ bits, or $256*2^m$ bits.

Alternatively, in another embodiment, the control information is uplink control information, and the control channel is a physical uplink control channel (PUCCH).

Alternatively, in another embodiment, the control information is a broadcast message, and the control channel is a physical broadcast channel (PBCH).

Optionally, the transmitting the N coded bits by using the first channel includes transmitting the N coded bits by using the first channel without rate matching.

Therefore, in this embodiment of this application, because a quantity of coded bits obtained after polar encoding is equal to a load size of a channel, no rate matching process is required when the N coded bits are transmitted by using the first channel. This reduces encoding overheads of a channel, and further reduces information transmission complexity.

In addition, in this embodiment of this application, because no rate matching is required, performance loss and latency that are associated with the rate matching operation are avoided.

It should be understood that in this embodiment of this application, the first channel may alternatively be an acknowledgment/negative acknowledgment (ACK/NACK) channel, a physical format indicator channel (PCFICH), a physical downlink shared channel (PDSCH), a physical uplink shared channel (PUSCH), or the like. Specifically, when the first channel is one of these channels, a specific process of transmitting the target information is similar to that in the foregoing embodiment, and no details are repeated in this embodiment of this application. Therefore, in this embodiment of this application, during channel encoding, because the mother code length N of the polar code sequence is equal to the load size of the first channel, no rate matching process is required when the N coded bits are transmitted by using the first channel. This reduces encoding overheads of a channel. In addition, because no rate matching is required, channel encoding complexity and latency are greatly reduced, and performance loss associated with rate matching operation is avoided.

According to a second aspect, an information transmission method is provided, where the method includes: receiving N coded bits by using a first channel, where the N coded bits are obtained after polar encoding is performed on target information that needs to be transmitted, a load size of the first channel is N bits, N is $2^n$, and n is a positive integer; and performing polar decoding on the N coded bits to obtain the target information that needs to be transmitted.

Therefore, in this embodiment of this application, because a quantity of coded bits obtained after polar encoding is equal to a load size of a channel, and a transmit end does not perform a rate matching process, a receive end does not need to perform a rate de-matching process during decoding. This reduces information transmission complexity.

It should be understood that the second aspect corresponds to the first aspect, an entity for executing the first aspect is a transmit-end device, an entity for executing the second aspect may be a receive-end device, and for a corresponding feature of the method on a side of the receive-end device, refer to corresponding descriptions on a side of the transmit-end device in the first aspect. Therefore, for brevity, details are properly omitted.

Optionally, the target information is control information, and the first channel is a control channel.

Optionally, the load size of the control channel corresponds to a format of the control channel. The format of the control channel is one of a plurality of preset channel formats. Each of the plurality of channel formats corresponds to one channel load size. Each of a plurality of load sizes corresponding to the plurality of channel formats is a positive integer power of 2.

Optionally, the control information is DCI, and the control channel is a PDCCH.

Optionally, a control channel element CCE of the PDCCH includes $2^x$ resource element groups REGs, where x is a positive integer.

Optionally, the CCE includes eight REGs.

Alternatively, the control information is uplink control information, and the control channel is a PUCCH.

Alternatively, the control information is a broadcast message, and the control channel is a PBCH.

Optionally, the performing polar decoding on the N coded bits includes performing polar decoding on the N coded bits without rate de-matching.

Therefore, in this embodiment of this application, because a quantity of coded bits obtained after polar encoding is equal to a load size of a channel, and a transmit end does not perform a rate matching process, a receive end does not need to perform a rate de-matching process during decoding. This reduces information transmission complexity.

According to a third aspect, a transmit-end device is provided and configured to execute the method in any one of the first aspect or the possible implementations of the first aspect. Specifically, the transmit-end device includes units configured to execute the method.

According to a fourth aspect, a receive-end device is provided and configured to execute the method in any one of the second aspect or the possible implementations of the second aspect. Specifically, the receive-end device includes units configured to execute the method.

According to a fifth aspect, a transmit-end device is provided, where the transmit-end device includes a processor and a memory, the memory is configured to store a computer program, and the processor is configured to execute the computer program stored in the memory, to execute the method in any one of the first aspect or the possible implementations of the first aspect.

According to a sixth aspect, a receive-end device is provided, where the receive-end device includes a processor and a memory, the memory is configured to store a computer program, and the processor is configured to execute the computer program stored in the memory, to execute the method in any one of the second aspect or the possible implementations of the second aspect.

According to a seventh aspect, a computer readable medium is provided and configured to store a computer program, where the computer program includes an instruction used to execute the method in any one of the first aspect or the possible implementations of the first aspect.

According to an eighth aspect, a computer readable medium is provided and configured to store a computer program, where the computer program includes an instruction used to execute the method in any one of the second aspect or the possible implementations of the second aspect.

DETAILED DESCRIPTION OF EMBODIMENTS

The following describes the technical solutions in this application with reference to the accompanying drawings.

The embodiments of this application may be applied to various communication systems. Therefore, the following description is not limited to a specific communication system. Examples of such communication systems include Global System for Mobile Communications (GSM) system, Code Division Multiple Access (CDMA) system, Wideband Code Division Multiple Access (WCDMA) system, general packet radio service (GPRS), Long Term Evolution (LTE) system, LTE frequency division duplex (FDD) system, LTE time division duplex (TDD) system, and universal mobile telecommunications system (UMTS). Information or data that can be encoded by a base station or a terminal in the foregoing systems using a conventional Turbo code or a LDPC code may also be encoded by using a polar code provided by the embodiments of the application.

In the embodiments of this application, a network device, for example, a base station, may be a device configured to communicate with a terminal device. For example, the network device may be a base transceiver station (BTS) in a GSM system or a CDMA system, may be a NodeB (NB) in a WCDMA system, or may be an evolved NodeB (eNB or eNodeB) in an LTE system. Alternatively, the base station may be a relay station, an access point, an in-vehicle device, a wearable device, a network-side device in a future 5G network, or the like.

The terminal device may communicate with one or more core networks by using a radio access network (RAN). The terminal may be user equipment (UE), an access terminal, a subscriber unit, a subscriber station, a mobile station, a mobile console, a remote station, a remote terminal, a mobile device, a user terminal, a wireless communications device, a user agent, or a user apparatus. The access terminal may be a cellular phone, a cordless phone, a Session Initiation Protocol (SIP) phone, a wireless local loop (WLL) station, a personal digital assistant (PDA), a handheld device having a wireless communication function, a computing device, a processing device connected to a wireless modem, an in-vehicle device, a wearable device, a terminal device in a future 5G network, or the like.

Figure 1:
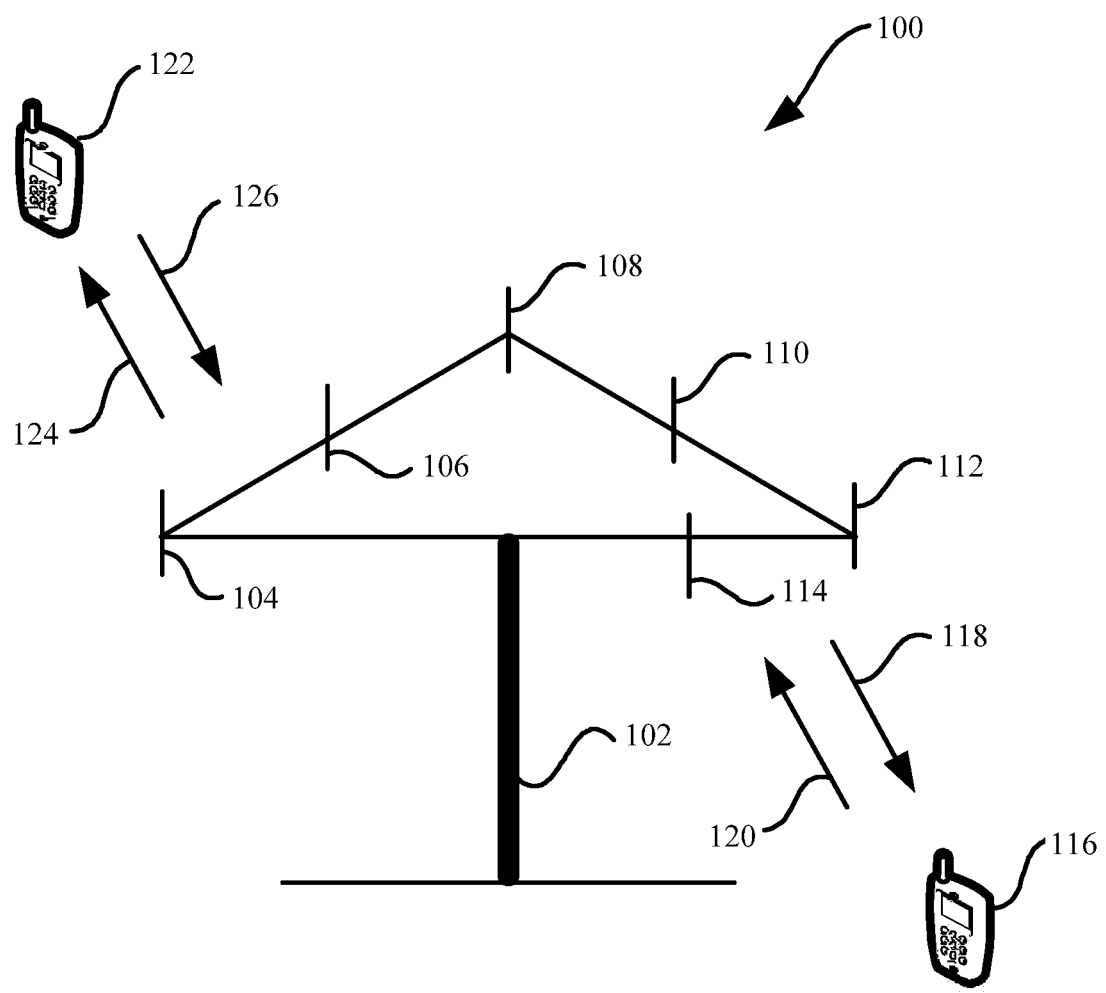
FIG. 1 is a schematic diagram of a wireless communications system in which embodiments of this application can be applied.

FIG. 1 shows a wireless communications system 100 according to the embodiments described in this specification. The system 100 includes a base station 102. The base station 102 may include a plurality of antenna groups. For example, one antenna group may include antennas 104 and 106. Another antenna group may include antennas 108 and 110. An additional antenna group may include antennas 112 and 114. For each antenna group, two antennas are shown. However, more or fewer antennas may be used for each group. The base station 102 may additionally include a transmitter chain and a receiver chain. Each of the transmitter chain and the receiver chain may include a plurality of components related to signal sending and receiving, for example, a processor, a modulator, a multiplexer, a demodulator, a demultiplexer, or an antenna.

The base station 102 may communicate with one or more access terminals, for example, an access terminal 116 and an access terminal 122. However, it is understood that the base station 102 may communicate with any quantity of access terminals essentially similar to the access terminals 116 and 122. The access terminals 116 and 122 may be, for example, a cellular phone, a smartphone, a portable computer, a handheld communications device, a handheld computing device, a satellite radio apparatus, a global positioning system, a PDA, and/or any other proper device configured to perform communication in the wireless communications system 100. As shown in FIG. 1, the access terminal 116 communicates with the antennas 112 and 114. The antennas 112 and 114 send information to the access terminal 116 by using a forward link 118, and receive information from the access terminal 116 by using a reverse link 120. In addition, the access terminal 122 communicates with the antennas 104 and 106. The antennas 104 and 106 send information to the access terminal 122 by using a forward link 124, and receive information from the access terminal 122 by using a reverse link 126. In a frequency division duplex (FDD) system, for example, the forward link 118 may use a frequency band different from that used by the reverse link 120, and the forward link 124 may use a frequency band different from that used by the reverse link 126. In addition, in a time division duplex (TDD) system, the forward link 118 and the reverse link 120 may use a same frequency band, and the forward link 124 and the reverse link 126 may use a same frequency band.

Each antenna group and/or area designed for communication is referred to as a sector of the base station 102. For example, an antenna group may be designed to communicate with an access terminal in a sector of a coverage area of the base station 102. During communication performed by using the forward links 118 and 124, transmitting antennas of the base station 102 may improve signal to noise ratios of the forward links 118 and 124 for the access terminals 116 and 122 through beamforming. In addition, compared with a manner in which a base station sends data to all access terminals of the base station by using a single antenna, the manner in which the base station 102 sends, through beamforming, data to the access terminals 116 and 122 randomly scattered in related coverage areas causes less interference to mobile terminals in neighboring cells.

In a given time, the base station 102, the access terminal 116, and/or the access terminal 122 may be a wireless communications apparatus for sending and/or a wireless communications apparatus for receiving. When data is to be sent, the wireless communications apparatus for sending may encode the data for transmission. Specifically, the wireless communications apparatus for sending may have, for example, generate, obtain, or store in a memory, a specified quantity of information bits that need to be sent, by using a channel, to the wireless communications apparatus for receiving. The information bits may be included in one or more data transport blocks. The information bits may be segmented to generate a plurality of code blocks. In addition, the wireless communications apparatus for sending may encode each code block by using a polar code encoder, to improve data transmission reliability and further ensure communication quality.

Figure 2:
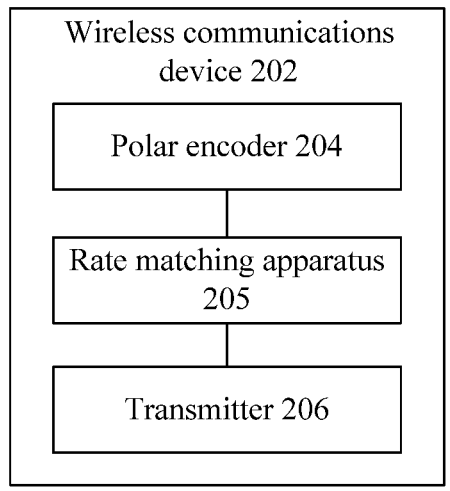
FIG. 2 is a simplified block diagram of a communications device according to an embodiment of this application.

FIG. 2 is a schematic block diagram of a system 200 to which a data transmission method in this application is applicable in a wireless communications environment. The system 200 includes a wireless communications device 202. The wireless communications device 202 is shown as sending data by using a channel. Although shown as sending data, the wireless communications device 202 may further receive data by using a channel. For example, the wireless communications device 202 may send and receive data simultaneously, or the wireless communications device 202 may send and receive data at different moments, or a combination thereof may be used. The wireless communications device 202 may be, for example, a network device, for example, a base station such as the base station 102 in FIG. 1, or may be an access terminal, for example, the access terminal 116 or 122 in FIG. 1.

The wireless communications device 202 may include a polar encoder 204, a rate matching apparatus 205, and a transmitter 206. Optionally, the wireless communications device 202 may further include a receiver for receiving data by using a channel. The receiver may exist alone, or may be integrated with the transmitter 206 to form a transceiver.

The polar encoder 204 is configured to perform encoding, and specifically packet encoding, on data to be transmitted from the wireless communications device 202. Then the packet encoding process is described in detail subsequently, and a target packet codeword is obtained by packet encoding.

The rate matching apparatus 205 is configured to perform interleaving, rate matching, and the like on the target packet codeword, to generate interleaved output bits.

In addition, the transmitter 206 may subsequently transmit, on a channel, output bits on which a process such as the rate matching is performed by the rate matching apparatus 205. For example, the transmitter 206 may send data to another wireless communications apparatus which is not shown in FIG. 2.

Figure 3:
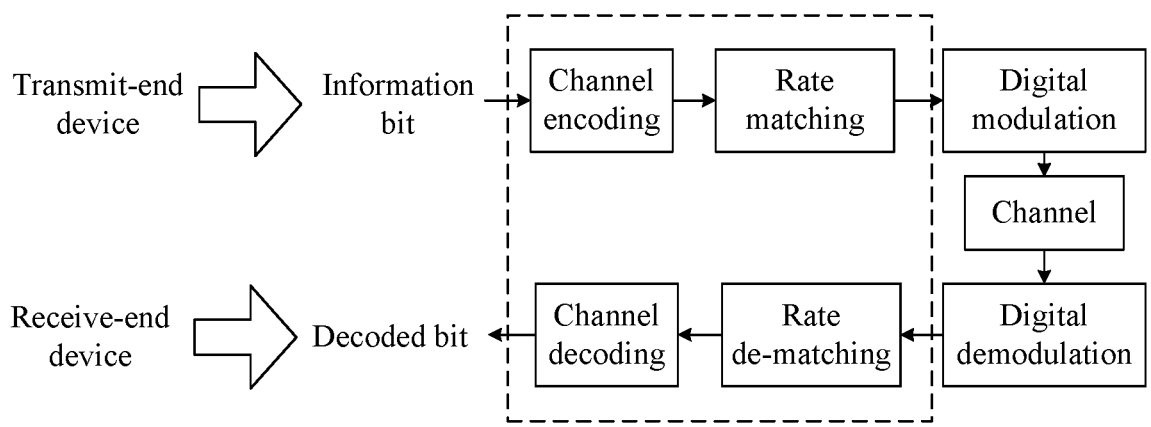
FIG. 3 is a flowchart of an information transmission process.

FIG. 3 is a flowchart of an existing information transmission method. Specifically, as shown in FIG. 3, when a transmit-end device needs to send information, the transmit-end device needs to first perform channel encoding and rate matching on information bits that need to be sent, to obtain a target code sequence. The transmit-end device then performs digital modulation on the target code sequence. Finally, the transmit-end device sends a modulated sequence by using a channel.

Correspondingly, after receiving the sequence transmitted by using the channel, a receive-end device obtains, by performing digital demodulation, rate de-matching, and channel decoding respectively, decoded bits corresponding to the information bits.

The information transmission method in FIG. 3 is merely an example, and an actual data transmission process may include other processes. For example, after the rate matching, processes of multiplexing and bit scrambling may be further performed. After a modulation process is performed, interleaving, cell-related scrambling, and mapping of a resource to a physical resource of a channel for transmission may be further performed. Contrarily, the receive end may perform corresponding inversed processes, to obtain the transmitted information.

For example, the information that needs to be transmitted may be downlink control information (DCI). The transmit end may perform, on the DCI, processes such as cyclic redundancy check (CRC), channel encoding, rate matching, multiplexing, bit scrambling, modulation, interleaving, cell-related scrambling, and resource mapping, and finally perform transmission by using a physical resource of a channel. Contrarily, the receive end performs corresponding inversed processes to obtain the DCI.

When channel encoding is performed in the foregoing process, a polar code may be used for encoding, and rate matching usually needs to be performed based on a load size of a current channel after the polar code is used for encoding.

A load size of a channel, in embodiments of this application, may be a code length of an actually transmitted polar code sequence, that is, a quantity of actually transmitted bits. In other words, the load size of the channel corresponds to a transport block (TB) size of the polar code sequence. After N coded bits are obtained by performing channel encoding using the polar code, rate matching needs to be performed to obtain actually transmitted bits corresponding to the load size.

If the information that needs to be sent is DCI and the transmission channel is a PDCCH, as listed in Table 1, when existing physical downlink control channel formats (PDCCH format) are 0 to 3 respectively, corresponding aggregation levels are 1, 2, 4, and 8 respectively, and quantities of included resource element groups (REGs) are, for example, 9, 18, 36, and 72. Each REG includes four resource elements (REs), and load sizes are 72 bits, 144 bits, 288 bits, and 576 bits respectively. The load size is a quantity of bits actually transmitted by using the PDCCH channel, that is, a code length of an actually transmitted polar code sequence. The load size and a mother code length of the polar code sequence are not matched at an existing channel aggregation level. Therefore, rate matching needs to be performed on coded bits of the polar code, to ensure that a bit length obtained after rate matching and a channel load are matched (equal).

Specifically, a length of a polar code sequence is equal to a mother code length, that is, a positive integer power of 2. If a polar code sequence that is equal to the load size needs to be obtained, rate matching needs to be performed on the coded bits, to obtain final transmitted bits.

Optionally, in an embodiment of this application, a mother code length of a polar code sequence may be determined based on the following formula:

$$N=2^{floor\lfloor log2(L-1)\rfloor+1}$$

where N is the mother code length, L is a load size, and floor $\lfloor \cdot \rfloor$ represents rounding down to the lower integer.

For example, if a load size is 72, it may be obtained, based on the foregoing formula, that a mother code length is 128. Then rate matching is performed on the 128 bits obtained through polar encoding. For example, 72 coded bits that match the load size are obtained through puncturing. It should be understood that the foregoing formula is merely an example. During actual application, a mother code length of a polar code sequence may be specifically determined depending on an actual situation, and is not limited in this embodiment of the application.

TABLE 1

Correspondence between a PDCCH format and a load size

| PDCCH format | Aggregation level | Quantity of REGs | Load size (bits) |
| --- | --- | --- | --- |
| 0 | 1 | 9 | 72 |
| 1 | 2 | 18 | 144 |
| 2 | 3 | 36 | 288 |
| 3 | 4 | 72 | 576 |

It should be noted that any rate matching operation in an existing information transmission process increases complexity and brings a performance loss. In order to solve this problem, in the embodiments of this application, for a scenario in which polar code channel encoding is performed in an information transmission process, a channel format is designed, so that a channel load size is $2^n$, that is, the load size is equal to a mother code length of a polar code sequence. In this manner, because a quantity of encoded bits obtained after polar encoding is equal to the load size of the channel, no rate matching process is required. This reduces encoding overheads of a channel. In addition, because no rate matching is required, channel encoding complexity and latency are greatly reduced, and the performance loss brought by the rate matching operation is avoided.

The following details an information transmission method provided by this application with reference to a specific embodiment.

Figure 4:
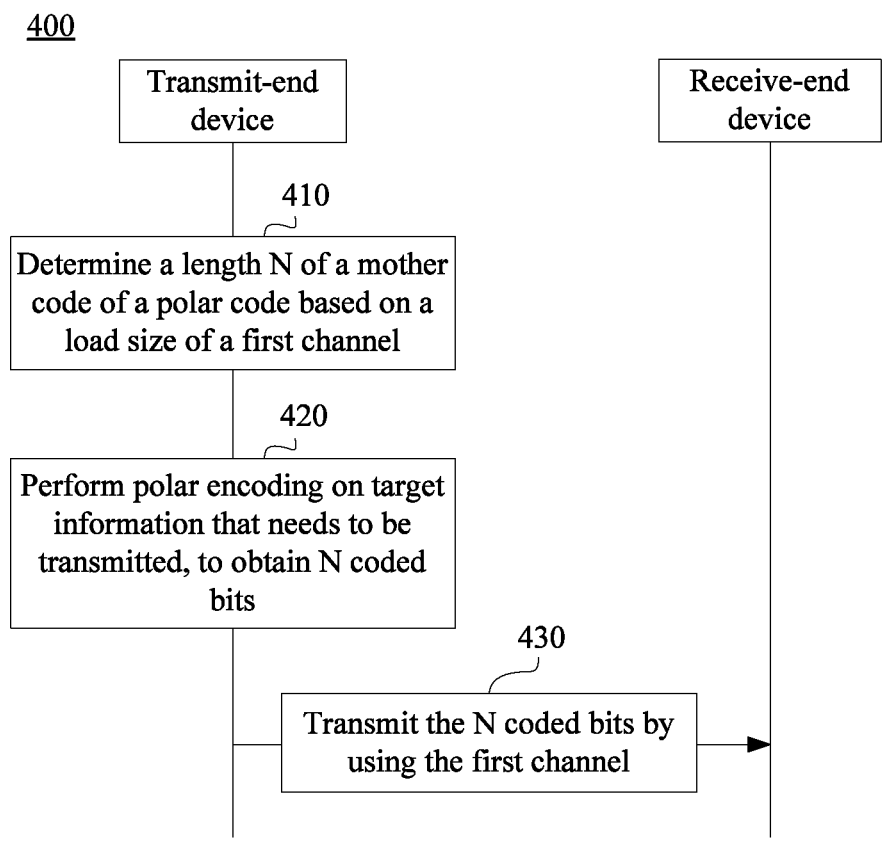
FIG. 4 is a flowchart of an information transmission method according to an embodiment of this application.

FIG. 4 is a flowchart of an information transmission method according to an embodiment of this application. The method may be applied to the foregoing communications systems. Detailed descriptions provided in FIG. 4 uses an LTE system as an example, but this embodiment of the application is not limited thereto. A communication system includes a network device and a terminal device. The transmit-end device shown in FIG. 4 may be a network device, and the receive-end device shown in FIG. 4 may be a terminal device. Alternatively, the transmit-end device may be the terminal device, and the receive-end device may be the network device.

Specifically, the method 400 shown in FIG. 4 includes the following steps.

410. The transmit-end device determines a mother code length N of a polar code sequence based on a load size of a first channel, where the load size of the first channel is N bits, N is $2^n$, and n is a positive integer.

In other words, the load size of the first channel is determined as the mother code length of the polar code sequence.

For example, the load size of the first channel is 32, 64, 128, or 256 bits. This embodiment of this application is not limited thereto.

It should be understood that a load size of a channel in this embodiment of this application may be a code length of an actually transmitted polar code sequence, that is, a quantity of actually transmitted bits. In other words, the load size of the channel corresponds to a transport block (TB) size of the polar code.

420. Perform polar encoding on target information that needs to be transmitted, to obtain N coded bits.

For example, after the mother code length N of the polar code sequence is determined, polar encoding is performed on the target information that needs to be transmitted, for example, K bits. That is, polar encoding is performed on the K bits and N−K fixed bits to obtain the N coded bits. Specifically, a process of performing polar encoding on the target information may be performed in an existing polar encoding scheme, and is not limited in this embodiment of this application.

It should be understood that when the target information is downlink information, the transmit-end device is the network device; or when the target information is uplink information, the transmit-end device is the terminal device.

It should be understood that the target information that needs to be transmitted in this embodiment of this application may be information obtained after source coding, or may be information obtained after encoding in another encoding scheme or even unencoded information. The information is collectively referred to as information bits herein.

430. Transmit the N coded bits by using the first channel, where the load size of the first channel is N bits.

Specifically, the N coded bits are transmitted by using the first channel without rate matching.

It should be understood that in this embodiment of this application, the transmitting the N coded bits by using the first channel may be transmitting, according to an existing information transmission process by using the first channel, a sequence obtained by performing digital modulation on the N coded bits.

In this embodiment of this application, because a quantity of coded bits obtained after polar encoding is equal to a load size of a channel, no rate matching process is required when the N coded bits are transmitted by using the first channel. This reduces encoding overheads of a channel, and further reduces information transmission complexity.

In addition, in this embodiment of this application, because no rate matching is required, performance loss and latency that are associated with the rate matching operation are avoided.

After receiving the N coded bits, the receive-end device may perform processes such as demodulation and polar decoding, to obtain the target information.

Specifically, the receive end performs polar decoding on the N coded bits without rate de-matching.

Therefore, in this embodiment of this application, because a quantity of coded bits obtained after polar encoding is equal to a load size of a channel, and a transmit end does not perform a rate matching process, a receive end does not need to perform a rate de-matching process during decoding. This reduces information transmission complexity.

Optionally, the target information is control information, and the first channel is a control channel.

It should be understood that the target information may alternatively be other information, for example, broadcast information, data information, acknowledgment information, or feedback information. Correspondingly, the first channel may be another channel, for example, a broadcast channel or a data channel. This is not limited in this embodiment of this application.

For example, when the information that needs to be transmitted is downlink control information (DCI), the first channel is a PDCCH, the transmit-end device is the network device, and the receive-end device is the terminal device, the network device performs polar encoding on the DCI to obtain N coded bits, and transmits the N coded bits by using the PDCCH. For example, after processes such as scrambling, modulation, and mapping are performed on the N coded bits, the N coded bits are transmitted by using a resource corresponding to the PDCCH. Correspondingly, the terminal device receives the N coded bits by using the PDCCH, and performs polar decoding on the N coded bits, to obtain the information that needs to be transmitted. Specifically, the terminal device may receive a signal on a candidate resource (a PDCCH) in a candidate resource set within a search space. When performing blind detection on a candidate resource, for example, when demodulating, based on a reference signal, the PDCCH carried on the candidate resource, the terminal device decodes received information bits of a control channel, and performs a CRC check based on an ID of the terminal device. If the check succeeds, the terminal device considers that the N coded bits sent to the terminal device are successfully received, and then performs polar decoding to obtain the to-be-transmitted information. If the check fails, the terminal device considers that the network device does not send information to the terminal device on the candidate resource.

Optionally, in another embodiment, the load size of the control channel corresponds to a format of the control channel. The format of the control channel is one of a plurality of preset channel formats. Each of the plurality of channel formats corresponds to one channel load size. Each of a plurality of load sizes corresponding to the plurality of channel formats is a positive integer power of 2.

For example, when the control information is downlink control information (DCI), and the control channel is a physical downlink control channel (PDCCH), the N bits may correspond to a format of the current channel. To be specific, the network device may determine a PDCCH format based on a channel status, determine a load size N corresponding to the format, and then perform polar encoding on the DCI to obtain N coded bits corresponding to the load size of the channel.

For example, the plurality of preset channel formats may be PDCCH formats 0 to 3. The network device may determine a PDCCH format for current to-be-transmitted DCI based on a current channel status, for example, channel quality and/or a channel congestion status. In this case, an aggregation level and a load size of a channel are also determined for transmitting the DCI. Because the load size N is equal to $2^n$, N may be used as a mother code length of a polar code sequence, and then polar encoding is performed on the DCI to obtain N coded bits. Because the load size of the PDCCH is also N bits, the N coded bits can be transmitted by using the PDCCH without rate matching.

The aggregation level is used to represent a size of the candidate resource. The network device selects one candidate resource from a set of a plurality of candidate resources that is corresponding to the aggregation level, to carry the DCI. For detailed descriptions of the aggregation level, refer to definitions in an existing standard, and no details are repeated herein.

In this embodiment of this application, different aggregation levels are set for different PDCCH formats. The following provides descriptions by using an example. For example, in this embodiment of this application, for different aggregation levels, an aggregation resource occupied by a channel may include one CCE or a plurality of consecutive CCEs in first one to three orthogonal frequency division multiplexing OFDM symbols of a subframe. A CCE in the PDCCH (that is, a CCE occupied by the PDCCH) includes resource element groups REGs whose quantity is a positive integer power of 2.

Specifically, when a format of the PDCCH is m, an aggregation level is $2^n$, and a time-frequency resource occupied by the PDCCH is $2^m$ control channel elements CCEs, where m=0, 1, 2, 3 . . . ; each CCE includes $2^x$ resource element groups REGs, where x is a positive integer; and each REG includes four resource elements REs.

For example, when a format of the PDCCH is 0, an aggregation level is 1, and a time-frequency resource occupied by the PDCCH is one control channel element CCE. When a format of the PDCCH is 1, an aggregation level is 2, and a time-frequency resource occupied by the PDCCH is two CCEs. When a format of the PDCCH is 2, an aggregation level is 4, and a time-frequency resource occupied by the PDCCH is four CCEs. When a format of the PDCCH is 3, an aggregation level is 8, and a time-frequency resource occupied by the PDCCH is eight CCEs. When a format of the PDCCH is 4, an aggregation level is 16, and a time-frequency resource occupied by the PDCCH is 16 CCEs.

For example, each CCE includes 2, 4, 8, or 16 REGs, provided that a quantity of resource element groups REGs included in the CCE is a positive integer power of 2. This is not limited in this embodiment of this application.

The following describes a load size for each PDCCH format by using an example in which each CCE includes eight REGs.

Specifically, when the format of the PDCCH is m, a load size of the PDCCH may be $64*2^m$ bits, $128*2^m$ bits, or $256*2^m$ bits.

For example, as listed in Table 2, when each CCE includes eight REGs and a modulation method is Quadrature Phase Shift Keying (QPSK), the load size of the PDCCH is $64*2^m$ bits. Specifically, when the format of the PDCCH is 0, the load size of the PDCCH is 64 bits. When the format of the PDCCH is 1, the load size of the PDCCH is 128 bits. When the format of the PDCCH is 2, the load size of the PDCCH is 256 bits. When the format of the PDCCH is 3, the load size of the PDCCH is 512 bits.

TABLE 2

Correspondence between a PDCCH format and a load size in this application

| PDCCH format | Aggregation level | Quantity of REGs | Load size (bits) |
|---|---|---|---|
| 0 | 1 | 8 | 64 |
| 1 | 2 | 16 | 128 |
| 2 | 3 | 32 | 256 |
| 3 | 4 | 64 | 512 |

It should be understood that examples in Table 2 are about load sizes corresponding to all PDCCH formats in the modulation method of QPSK. Specifically, when a PDCCH format is 0, a PDCCH includes 32 REs. Each RE may carry one QPSK symbol. Because one QPSK symbol corresponds to two bits, when a modulation method is QPSK and a PDCCH format is 0, a corresponding load size is 64 bits. A case in which a PDCCH format is another value is similar to this case, and no details are repeated herein.

It should be noted that Table 2 lists only a specific example in which a modulation method is QPSK and one CCE includes eight REGs. When a different modulation method is used or a quantity of REGs included in one CCE changes, a corresponding load size needs to be adjusted correspondingly. This embodiment of this application is not limited thereto.

For example, when each CCE includes eight REGs and a modulation method is 16 quadrature amplitude modulation (16QAM), the load size of the PDCCH is $128*2^m$ bits. Specifically, because one 16QAM symbol corresponds to four bits, when a modulation method is 16QAM and a PDCCH format is 0, a corresponding load size is 128 bits. A case in which a PDCCH format is another value is similar to this case, and no details are repeated herein.

For another example, when each CCE includes eight REGs and a modulation method is 64QAM, the load size of the PDCCH is $256*2^m$ bits. Specifically, because one 64QAM symbol corresponds to eight bits, when a modulation method is 64QAM and a PDCCH format is 0, a corresponding load size is 256 bits. A case in which a PDCCH format is another value is similar to this case, and no details are repeated herein.

By analogy, when a modulation method is changed to another scheme, the load size of the PDCCH may be changed correspondingly. This embodiment of this application is not limited thereto.

The foregoing details a case in which the control information is DCI and the control channel is a PDCCH. Alternatively, in another embodiment, the control information may be uplink control information, and the control channel may be a physical uplink control channel PUCCH.

For example, different PUCCH formats in existing LTE correspond to different channel load sizes. For example, for a format 2/2A/2B, a channel load size is 20 (bits); for a format 3, a channel load size is 32; for a format 4, a channel load size is 288y (y=1/2/3/4/5/6/8); and for a format 5, a channel load size is 144. When a channel load size is different from a mother code length of a polar code sequence, rate matching needs to be performed during polar encoding, so that a coding length obtained after rate matching is equal to a channel load size of a PUCCH. Therefore, in this embodiment of this application, based on formats of the PUCCH, a load size for the format 2/2A/2B/3 may be designed to 32; a load size for the format 4 may be designed to 512y (y=1/2/4/8); and a load size for the format 5 may be designed to 256.

It should be understood that for each process of transmitting the uplink control information on the PUCCH, reference may be made to an existing PUCCH transmission process. A difference between this embodiment of this application and existing PUCCH transmission lies in that in this embodiment of this application, no rate matching process is required after channel encoding. Other processes may be similar to the existing PUCCH transmission process, and no details are repeated herein.

Therefore, because a quantity of coded bits obtained after polar encoding is equal to a load size in this embodiment of this application, no rate matching process is required in this embodiment of this application. This reduces encoding overheads of a control channel. In addition, because no rate matching is required, channel encoding complexity and latency are greatly reduced, and performance loss associated with rate matching operation is avoided.

Alternatively, in another embodiment, the control information is a broadcast message, and the control channel is a physical broadcast channel PBCH.

For example, in LTE, when an original bit length of the PBCH is 24 bits, a 16-bit CRC is added, and an obtained PBCH is encoded to 120 bits by using a ⅓ tail-biting convolutional code, to perform rate matching. For a normal cyclic prefix (CP), a quantity of bits obtained after rate matching is 1920 bits; and for an extended CP, a quantity of bits obtained after rate matching is 1728 bits. In this design of this application, there are a total of 40 bits for information bits and check bits of the PBCH, and a load size of the PBCH may be set to 2048 bits. Therefore, in this embodiment of this application, encoding may be performed based on a polar code whose mother code length is 2048 bits. In this way, a rate matching process is omitted, and output lengths for the normal CP and the extended CP may be unified to 2048 bits. This simplifies a system design.

It should be understood that for each process of transmitting the broadcast message on the PBCH, reference may be made to an existing PBCH transmission process. A difference between this embodiment of this application and existing PBCH transmission lies in that in this embodiment of this application, no rate matching process is required after channel encoding. Other processes may be similar to the existing PBCH transmission process, and no details are repeated herein.

Therefore, in this embodiment of this application, because a quantity of coded bits obtained after polar encoding is equal to a load size of a channel, no rate matching process is required when the N coded bits are transmitted by using the first channel. This reduces encoding overheads of a channel, and further reduces information transmission complexity.

It should be understood that the foregoing describes examples in which the first channel is an uplink control channel, a downlink control channel, and a broadcast channel, but this embodiment of this application is not limited thereto. The first channel may alternatively be an acknowledgment/negative acknowledgment (ACK/NACK) channel, a physical format indicator channel (PCFICH), a physical downlink shared channel (PDSCH), a physical uplink shared channel (PUSCH), or the like. Specifically, when the first channel is one of these channels, a specific process of transmitting the target information is similar to that in the foregoing embodiment, and no details are repeated in this embodiment of this application. Therefore, in this embodiment of this application, during channel encoding, because the mother code length N of the polar code sequence is equal to the load size of the first channel, no rate matching process is required when the N coded bits are transmitted by using the first channel. This reduces encoding overheads of a channel, and further reduces information transmission complexity.

In addition, in this embodiment of this application, because no rate matching is required, performance loss and latency associated with rate matching operation are avoided.

In the foregoing, the information transmission method in the embodiments of this application is detailed with reference to FIG. 1 to FIG. 4. It should be noted that examples in FIG. 1 to FIG. 4 are merely intended to help a person skilled in the art understand the embodiments of this application, rather than limit the embodiments of this application to specific values or specific scenarios that are shown as examples. Obviously, a person skilled in the art can make any equivalent modification or change based on the provided examples in FIG. 1 to FIG. 4, and the modification or change also falls within the scope of the embodiments of this application.

Figure 5:
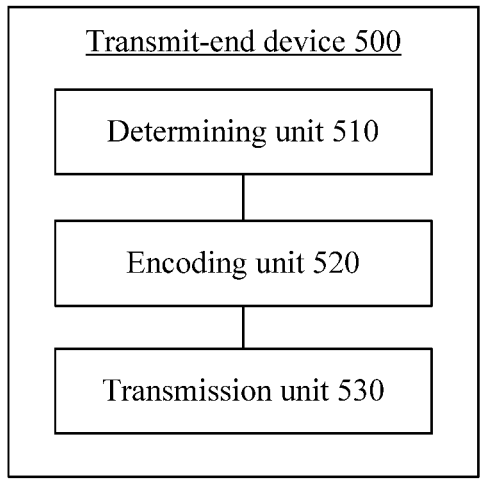
FIG. 5 is a functional block diagram of a transmit-end device according to an embodiment of this application.
Figure 6:
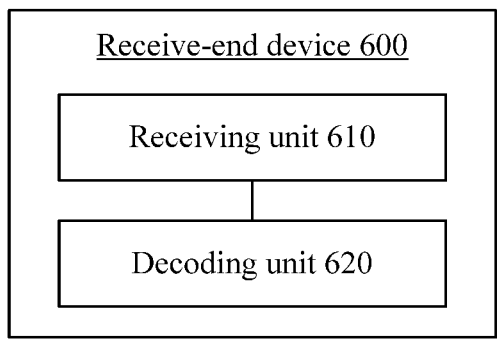
FIG. 6 is a functional block diagram of a receive-end device according to an embodiment of this application.
Figure 7:
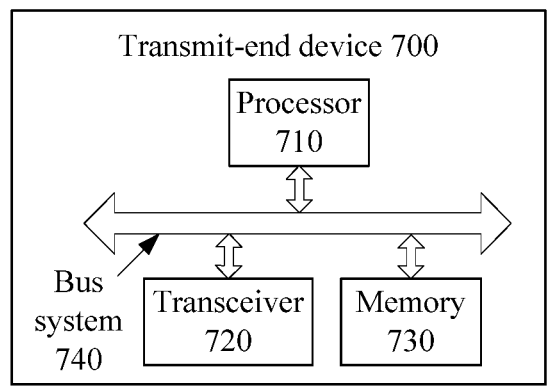
FIG. 7 is a block diagram of a transmit-end device according to another embodiment of this application.
Figure 8:
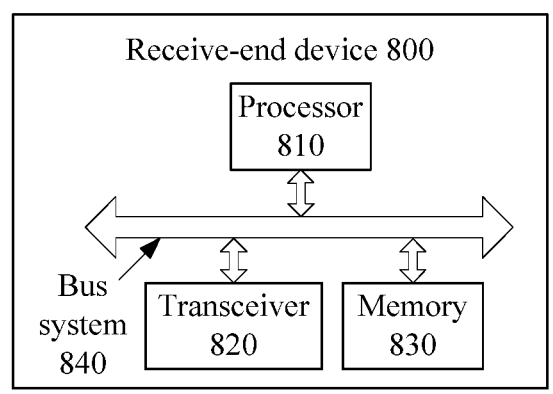
FIG. 8 is a block diagram of a receive-end device according to another embodiment of this application.

The following describes a transmit-end device in an embodiment of this application with reference to FIG. 5 and FIG. 7, and describes a receive-end device in an embodiment of this application with reference to FIG. 6 and FIG. 8.

FIG. 5 is a schematic block diagram of a transmit-end device 500 according to an embodiment of this application. It should be understood that when target information that needs to be transmitted is downlink information, the transmit-end device is a network device, or when target information that needs to be transmitted is uplink information, the transmit-end device is a terminal device. Specifically, as shown in FIG. 5, the transmit-end device 500 includes:

a determining unit 510, configured to determine a mother code length N of a polar code sequence based on a load size of a first channel, where the load size of the first channel is N bits, N is $2^n$, and n is a positive integer;

an encoding unit 520, configured to perform polar encoding on target information that needs to be transmitted, to obtain N coded bits; and a transmission unit 530, configured to transmit the N coded bits by using the first channel.

Therefore, because a quantity of coded bits obtained after polar encoding is equal to a load size of a channel, in this embodiment of this application, no rate matching process is required when the N coded bits are transmitted by using the first channel. This reduces encoding overheads of a channel, and further reduces information transmission complexity.

In addition, in this embodiment of this application, because no rate matching is required, performance loss and latency associated with the rate matching operation are avoided.

Optionally, in another embodiment, the target information is control information, and the first channel is a control channel.

Optionally, in another embodiment, the load size of the control channel corresponds to a format of the control channel. The format of the control channel is one of a plurality of preset channel formats. Each of the plurality of channel formats corresponds to one channel load size. Each of a plurality of load sizes corresponding to the plurality of channel formats is a positive integer power of 2.

Optionally, in another embodiment, the control information is downlink control information DCI, and the control channel is a physical downlink control channel (PDCCH).

Optionally, in another embodiment, a control channel element (CCE) of the PDCCH includes $2^x$ resource element groups (REGs), where x is a positive integer.

Optionally, in another embodiment, the CCE includes eight REGs.

Alternatively, in another embodiment, the control information is uplink control information, and the control channel is a physical uplink control channel (PUCCH).

Alternatively, in another embodiment, the control information is a broadcast message, and the control channel is a physical broadcast channel (PBCH).

Optionally, in another embodiment, the transmission unit 530 is specifically configured to transmit the N coded bits by using the first channel without rate matching.

It should be understood that the transmit-end device 500 shown in FIG. 5 can implement processes related to the transmit-end device in the method embodiment in FIG. 4. Operations and/or functions of modules in the transmit-end device 500 are used to implement corresponding procedures in the method embodiment in FIG. 4, respectively. For details, refer to the descriptions in the method embodiment. To avoid repetition, details are properly omitted herein.

Therefore, because a quantity of coded bits obtained after polar encoding is equal to a load size of a channel, in this embodiment of this application, no rate matching process is required when the N coded bits are transmitted by using the first channel. This reduces encoding overheads of a channel, and further reduces information transmission complexity.

In addition, in this embodiment of this application, because no rate matching is required, performance loss and latency associated with the rate matching operation are avoided.

FIG. 6 is a schematic block diagram of a receive-end device 600 according to an embodiment of this application. It should be understood that when target information that needs to be transmitted is downlink information, the receive-end device is a terminal device, or when target information that needs to be transmitted is uplink information, the receive-end device is a network device. Specifically, as shown in FIG. 6, the receive-end device 600 includes:

a receiving unit 610, configured to receive N coded bits by using a first channel, where the N coded bits are obtained after polar encoding is performed on target information that needs to be transmitted, a load size of the first channel is N bits, N is $2^n$, and n is a positive integer; and a decoding unit 620, configured to perform polar decoding on the N coded bits to obtain the target information that needs to be transmitted.

Therefore, in this embodiment of this application, because a quantity of coded bits obtained after polar encoding is equal to a load size of a channel, and a transmit end does not perform a rate matching process, a receive end does not need to perform a rate de-matching process during decoding. This reduces information transmission complexity.

Optionally, in another embodiment, the target information is control information, and the first channel is a control channel.

Optionally, in another embodiment, the load size of the control channel corresponds to a format of the control channel. The format of the control channel is one of a plurality of preset channel formats. Each of the plurality of channel formats corresponds to one channel load size. Each of a plurality of load sizes corresponding to the plurality of channel formats is a positive integer power of 2.

Optionally, in another embodiment, the control information is downlink control information DCI, and the control channel is a physical downlink control channel (PDCCH).

Optionally, in another embodiment, a control channel element (CCE) of the PDCCH includes $2^x$ resource element groups (REGs), where x is a positive integer.

Optionally, in another embodiment, the CCE includes eight REGs.

Alternatively, in another embodiment, the control information is uplink control information, and the control channel is a physical uplink control channel (PUCCH).

Alternatively, in another embodiment, the control information is a broadcast message, and the control channel is a physical broadcast channel (PBCH).

Optionally, in another embodiment, the decoding unit 620 is specifically configured to perform polar decoding on the N coded bits without rate de-matching.

It should be understood that the receive-end device 600 shown in FIG. 6 can implement processes related to the receive-end device in the method embodiment in FIG. 4. Operations and/or functions of modules in the receive-end device 600 are used to implement corresponding procedures in the method embodiment in FIG. 4, respectively. For details, refer to the descriptions in the method embodiment. To avoid repetition, details are properly omitted herein.

Therefore, in this embodiment of this application, because a quantity of coded bits obtained after polar encoding is equal to a load size of a channel, and a transmit end does not perform a rate matching process, a receive end does not need to perform a rate de-matching process during decoding. This reduces information transmission complexity.

FIG. 7 is a schematic block diagram of a transmit-end device 700 according to an embodiment of this application. It should be understood that when target information that needs to be transmitted is downlink information, the transmit-end device is a network device, or when target information that needs to be transmitted is uplink information, the transmit-end device is a terminal device. Specifically, as shown in FIG. 7, the transmit-end device 700 includes a processor 710 and a transceiver 720. The processor 710 is connected to the transceiver 720. Optionally, the transmit-end device 700 further includes a memory 730. The memory 730 is connected to the processor 710. Further, optionally, the transmit-end device 700 may further include a bus system 740. The processor 710, the memory 730, and the transceiver 720 may be connected by using the bus system 740, the memory 730 may be configured to store instructions, and the processor 710 is configured to execute the instructions stored in the memory 730, to control the transceiver 720 to receive and send information or signals.

Specifically, the processor 710 is configured to: determine a mother code length N of a polar code sequence based on a load size of a first channel, where the load size of the first channel is N bits, N is $2^n$, and n is a positive integer; perform polar encoding on target information that needs to be transmitted, to obtain N coded bits; and control the transceiver 720 to transmit the N coded bits by using the first channel.

Therefore, because a quantity of coded bits obtained after polar encoding is equal to a load size of a channel, in this embodiment of this application, no rate matching process is required when the N coded bits are transmitted by using the first channel. This reduces encoding overheads of a channel, and further reduces information transmission complexity.

In addition, in this embodiment of this application, because no rate matching is required, performance loss and latency associated with the rate matching operation are avoided.

It should be understood that in this embodiment of this application, the processor 710 may be a central processing unit (CPU), or the processor 710 may be a general-purpose processor, a digital signal processor (DSP), an application-specific integrated circuit (ASIC), a field-programmable gate array (FPGA) or another programmable logic device, a discrete gate or transistor logic device, a discrete hardware component, or the like. The general-purpose processor may be a microprocessor, or the processor may be any conventional processor or the like.

The memory 730 may include a read-only memory and a random access memory, and provide instructions and data for the processor 710. A part of the memory 730 may further include a non-volatile random access memory. For example, the memory 730 may further store device type information.

The bus system 740 may include not only a data bus but also a power bus, a control bus, a status signal bus, and the like. However, for clarity of description, various buses are denoted by the bus system 740 in the figure.

In an implementation process, the steps of the method may be performed by an integrated logic circuit of hardware in the processor 710, or by software instructions. The steps of the methods disclosed with reference to the embodiments of this application may be directly performed by a hardware processor, or may be performed by a combination of hardware in a processor and a software module. The software module may be located in a mature storage medium in the art, such as a random access memory, a flash memory, a read-only memory, a programmable read-only memory or an erasable programmable memory, or a register. The storage medium is located in the memory 730, and the processor 710 reads information in the memory 730 and performs, in combination with its hardware, the steps of the foregoing methods. To avoid repetition, no detailed description is provided herein again.

Optionally, in another embodiment, the target information is control information, and the first channel is a control channel.

Optionally, in another embodiment, the load size of the control channel corresponds to a format of the control channel. The format of the control channel is one of a plurality of preset channel formats. Each of the plurality of channel formats corresponds to one channel load size. Each of a plurality of load sizes corresponding to the plurality of channel formats is a positive integer power of 2.

Optionally, in another embodiment, the control information is downlink control information DCI, and the control channel is a physical downlink control channel PDCCH.

Optionally, in another embodiment, a control channel element (CCE) of the PDCCH includes $2^x$ resource element groups (REGs), where x is a positive integer.

Optionally, in another embodiment, the CCE includes eight REGs.

Alternatively, in another embodiment, the control information is uplink control information, and the control channel is a physical uplink control channel (PUCCH).

Alternatively, in another embodiment, the control information is a broadcast message, and the control channel is a physical broadcast channel (PBCH).

Optionally, in another embodiment, the transceiver 720 is specifically configured to transmit the N coded bits by using the first channel without rate matching.

It should be understood that the transmit-end device 700 shown in FIG. 7 can implement processes related to the transmit-end device in the method embodiment in FIG. 4. Operations and/or functions of modules in the transmit-end device 700 are used to implement corresponding procedures in the method embodiment in FIG. 4, respectively. For details, refer to the descriptions in the method embodiment. To avoid repetition, details are properly omitted herein.

Therefore, because a quantity of coded bits obtained after polar encoding is equal to a load size of a channel, in this embodiment of this application, no rate matching process is required when the N coded bits are transmitted by using the first channel. This reduces encoding overheads of a channel, and further reduces information transmission complexity.

In addition, in this embodiment of this application, because no rate matching is required, performance loss and latency associated with the rate matching operation are avoided.

FIG. 8 is a schematic block diagram of a receive-end device 800 according to an embodiment of this application. It should be understood that when target information that needs to be transmitted is downlink information, the receive-end device is a terminal device, or when target information that needs to be transmitted is uplink information, the receive-end device is a network device. Specifically, as shown in FIG. 8, the receive-end device 800 includes a processor 810 and a transceiver 820, where the processor 810 is connected to the transceiver 820.

Optionally, the transmit-end device 800 further includes a memory 830. The memory 830 is connected to the processor 810. Further, optionally, the transmit-end device 800 may further include a bus system 840. The processor 810, the memory 830, and the transceiver 820 may be connected by using the bus system 840, the memory 830 may be configured to store instructions, and the processor 810 is configured to execute the instructions stored in the memory 830, to control the transceiver 820 to receive and send information or signals.

Specifically, the processor 810 controls the transceiver 820 to receive N coded bits by using a first channel, where the N coded bits are obtained after polar encoding is performed on target information that needs to be transmitted, a load size of the first channel is N bits, N is $2^n$, and n is a positive integer. The processor 810 is configured to perform polar decoding on the N coded bits to obtain the target information that needs to be transmitted.

Therefore, in this embodiment of this application, because a quantity of coded bits obtained after polar encoding is equal to a load size of a channel, and a transmit end does not perform a rate matching process, a receive end does not need to perform a rate de-matching process during decoding. This reduces information transmission complexity.

It should be understood that in this embodiment of this application, the processor 810 may be a central processing unit (CPU), or the processor 810 may be a general-purpose processor, a digital signal processor (DSP), an application-specific integrated circuit (ASIC), a field-programmable gate array (FPGA) or another programmable logic device, a discrete gate or transistor logic device, a discrete hardware component, or the like. The general-purpose processor may be a microprocessor, or the processor may be any conventional processor or the like.

The memory 830 may include a read-only memory and a random access memory, and provide instructions and data for the processor 810. A part of the memory 830 may further include a non-volatile random access memory. For example, the memory 830 may further store device type information.

The bus system 840 may include not only a data bus but also a power bus, a control bus, a status signal bus, and the like. However, for clarity of description, various buses are denoted by the bus system 840 in the figure.

In an implementation process, the steps of the method may be performed by an integrated logic circuit of hardware in the processor 810, or by software instructions. The steps of the methods disclosed with reference to the embodiments of this application may be directly performed by a hardware processor, or may be performed by a combination of hardware in a processor and a software module. The software module may be located in a mature storage medium in the art, such as a random access memory, a flash memory, a read-only memory, a programmable read-only memory or an erasable programmable memory, or a register. The storage medium is located in the memory 830, and the processor 810 reads information in the memory 830 and performs, in combination with its hardware, the steps of the foregoing methods. To avoid repetition, no detailed description is provided herein again.

Optionally, in another embodiment, the target information is control information, and the first channel is a control channel.

Optionally, in another embodiment, the load size of the control channel corresponds to a format of the control channel. The format of the control channel is one of a plurality of preset channel formats. Each of the plurality of channel formats corresponds to one channel load size. Each of a plurality of load sizes corresponding to the plurality of channel formats is a positive integer power of 2.

Optionally, in another embodiment, the control information is downlink control information DCI, and the control channel is a physical downlink control channel (PDCCH).

Optionally, in another embodiment, a control channel element (CCE) of the PDCCH includes $2^x$ resource element groups (REGs), where x is a positive integer.

Optionally, in another embodiment, the CCE includes eight REGs.

Alternatively, in another embodiment, the control information is uplink control information, and the control channel is a physical uplink control channel (PUCCH).

Alternatively, in another embodiment, the control information is a broadcast message, and the control channel is a physical broadcast channel (PBCH).

Optionally, in another embodiment, the processor 810 is specifically configured to perform polar decoding on the N coded bits without rate de-matching.

It should be understood that the receive-end device 800 shown in FIG. 8 can implement processes related to the receive-end device in the method embodiment in FIG. 4. Operations and/or functions of modules in the receive-end device 800 are used to implement corresponding procedures in the method embodiment in FIG. 4, respectively. For details, refer to the descriptions in the method embodiment. To avoid repetition, details are properly omitted herein.

Therefore, in this embodiment of this application, because a quantity of coded bits obtained after polar encoding is equal to a load size of a channel, and a transmit end does not perform a rate matching process, a receive end does not need to perform a rate de-matching process during decoding. This reduces information transmission complexity.

It should be understood that "one embodiment" or "an embodiment" mentioned in the whole specification means that particular features, structures, or characteristics related to the embodiment are included in at least one embodiment of this application. Therefore, "in one embodiment" or "in an embodiment" that appears throughput the whole specification does not necessarily mean a same embodiment. Moreover, the particular feature, structure or characteristic may be combined in one or more embodiments in any proper manner. It should be understood that sequence numbers of the foregoing processes do not mean execution sequences in various embodiments of this application. The execution sequences of the processes should be determined based on functions and internal logic of the processes, and should not be construed as any limitation on the implementation processes of the embodiments of this application.

In addition, the terms "system" and "network" may be used interchangeably in this specification. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that in the embodiments of this application, "B corresponding to A" indicates that B is associated with A, and B may be determined based on A. However, it should further be understood that determining B based on A does not mean that B is determined based on A only; B may also be determined based on A and/or other information.

A person of ordinary skill in the art may be aware that the units and steps in the examples described with reference to the embodiments disclosed in this specification may be implemented by electronic hardware, computer software, or a combination thereof. To clearly describe the interchangeability between the hardware and the software, the foregoing has generally described compositions and steps of each example based on functions. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for convenience and brevity of description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the shown or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate, and parts shown as units may or may not be physical units, may be located in one position, or may be distributed on a plurality of network units. Some or all of the units may be selected depending on actual needs to achieve the objectives of the solutions of the embodiments in this application.

In addition, functional units in the embodiments of this application may be integrated into one processing unit, or each of the units may exist alone physically, or two or more units may be integrated into one unit. The integrated unit may be implemented in a form of hardware, or may be implemented in a form of a software functional unit.

With descriptions of the foregoing embodiments, a person skilled in the art may clearly understand that this application may be implemented by hardware, firmware or a combination thereof. When this application is implemented by software, the foregoing functions may be stored in a computer readable medium or transmitted as one or more instructions or code in the computer readable medium. The computer readable medium includes a computer storage medium and a communications medium, where the communications medium includes any medium that enables a computer program to be transmitted from one place to another. The storage medium may be any available medium accessible to a computer. The following provides an example but does not impose a limitation: The computer readable medium may include a RAM, a ROM, an EEPROM, a CD-ROM, or another optical disc storage or disk storage medium, or another magnetic storage device, or any other medium that can carry or store expected program code in a form of instructions or a data structure and can be accessed by a computer. In addition, any connection may be appropriately defined as a computer readable medium. For example, if software is transmitted from a website, a server or another remote source by using a coaxial cable, an optical fiber/cable, a twisted pair, a digital subscriber line (DSL), or wireless technologies such as infrared ray, radio, and microwave, the coaxial cable, optical fiber/cable, twisted pair, DSL, or wireless technologies such as infrared ray, radio, and microwave are included in definition of a medium to which they belong. For example, a disk and disc used in this application include a compact disc (CD), a laser disc, an optical disc, a digital versatile disc (DVD), a floppy disk and a Blu-ray disc, where the disk generally copies data by a magnetic means, and the disc copies data optically by a laser means. The foregoing combination should also be included in the protection scope of the computer readable medium.

In summary, what is described above is merely examples of embodiments of the technical solutions of this application, but is not intended to limit the protection scope of this application. Any modification, equivalent replacement, or improvement made without departing from the principle of this application shall fall within the protection scope of this application.

What is claimed is:

1. An information transmission method, comprising:
   obtaining, by a communication device, K information bits, wherein K≥1;
   determining, by the communication device, a load size of a channel for transmitting the K information bits, wherein the load size of the channel is N bits, wherein N≥K, $N=2^n$, and n is a positive integer;
   performing, by the communication device, polar encoding on the K information bits, to obtain a polar code sequence comprising N bits; and
   transmitting, by the communication device, the polar code sequence using the channel;
   wherein the information bits carry control information, and the channel is a control channel; and
   wherein the load size of the control channel is determined by a format of the control channel, the format of the control channel is one of a plurality of preset channel formats, each of the plurality of preset channel formats corresponds to one load size, and each load size is an integer power of 2.

2. The method according to claim 1, wherein the control information is downlink control information (DCI), and the control channel is a physical downlink control channel (PDCCH).

3. The method according to claim 2, wherein a control channel element (CCE) of the PDCCH comprises $2^x$ resource element groups (REGs), wherein x is a positive integer.

4. The method according to claim 3, wherein the CCE comprises 2, 4, 8, or 16 REGs.

5. The method according to claim 1, wherein the control information is uplink control information, and the control channel is a physical uplink control channel (PDCCH).

6. The method according to claim 1, wherein the control information is a broadcast message, and the control channel is a physical broadcast channel (PBCH).

7. The method according to claim 1, wherein performing polar encoding on the K information bits, to obtain a polar code sequence comprising N bits comprises:
   obtaining a generator matrix of N rows×N columns;
   forming an N-bit sequence, wherein K bit locations of the N-bit sequence are occupied by K information bits, and remaining N−K bit locations are occupies by fixed-value bits; and
   generating the polar code sequence by multiplying the N-bit sequence with the generator matrix.

8. A communication device, comprising:
   a transceiver, and a processor;
   wherein the transceiver is configured to obtaining K information bits, wherein K≥1;
   wherein the processor is configured to:
   determine a load size of a channel for transmitting the K information bits, wherein the load size of the first channel is N bits, wherein N≥K, $N=2^n$, and n is a positive integer; and
   perform polar encoding on the K information bits, to obtain a polar code sequence comprising N bits;
   wherein the transceiver is further configured to transmit the polar code sequence using the channel;
   wherein the information bits carry control information, and the channel is a control channel; and
   wherein the load size of the control channel is determined by a format of the control channel, the format of the control channel is one of a plurality of preset channel formats, each of the plurality of preset channel formats corresponds to one load size, and each load size is an integer power of 2.

9. The communication device according to claim 8, wherein the control information is downlink control information (DCI), and the control channel is a physical downlink control channel (PDCCH).

10. The communication device according to claim 9, wherein a control channel element (CCE) of the PDCCH comprises $2^x$ resource element groups (REGs), wherein x is a positive integer.

11. The communication device according to claim 10, wherein the CCE comprises 2, 4, 8, or 16 REGs.

12. The communication device according to claim 8, wherein the control information is uplink control information, and the control channel is a physical uplink control channel (PUCCH).

13. The communication device according to claim 8, wherein the control information is a broadcast message, and the control channel is a physical broadcast channel (PBCH).

14. The communication device according to claim 8, wherein in performing polar encoding on the K information bits, to obtain a polar code sequence comprising N bits, the processor is configured to:

obtain a generator matrix of N rows×N columns;

form an N-bit sequence, wherein K bit locations of the N-bit sequence are occupied by K information bits, and remaining N−K bit locations are occupies by fixed-value bits; and generate the polar code sequence by multiplying the N-bit sequence with the generator matrix.

15. The communication device according to claim 8, wherein the communication device is a network device or a terminal device.

16. A non-transitory storage medium storing a computer program thereon for execution by a processor of a communication device, wherein the computer program includes instructions for the communication device to:

obtain K information bits, wherein K≥1;

determine a load size of a channel for transmitting the K information bits, wherein the load size of the first channel is N bits, wherein N≥K, $N=2^n$, and n is a positive integer;

perform polar encoding on the K information bits, to obtain a polar code sequence comprising N bits; and transmit the polar code sequence using the channel;

wherein the information bits carry control information, and the channel is a control channel; and wherein the load size of the control channel is determined by a format of the control channel, the format of the control channel is one of a plurality of preset channel formats, each of the plurality of preset channel formats corresponds to one load size, and each load size is an integer power of 2.

17. A communication apparatus, comprising:

a processor and a memory storing instructions for execution by the processor;

wherein the instructions, when executed by the processor, cause the apparatus to:

determine a load size of a channel for transmitting K information bits, wherein the load size of the channel is N bits, wherein N≥K, $N=2^n$, and n is a positive integer; and perform polar encoding on the K information bits, to obtain a polar code sequence comprising N bits;

wherein the information bits carry control information, and the channel is a control channel; and wherein the load size of the control channel is determined by a format of the control channel, the format of the control channel is one of a plurality of preset channel formats, each of the plurality of preset channel formats corresponds to one load size, and each load size is an integer power of 2.

* * * * *

UNITED STATES PATENT AND TRADEMARK OFFICE
CERTIFICATE OF CORRECTION

PATENT NO. : 10,966,118 B2
APPLICATION NO. : 16/352796
DATED : March 30, 2021
INVENTOR(S) : Li et al.

It is certified that error appears in the above-identified patent and that said Letters Patent is hereby corrected as shown below:

In the Claims

In Column 24, Claim 5, Line 9, delete "PDCCH" and insert --PUCCH--, therefor.

Signed and Sealed this
Eighteenth Day of April, 2023

Katherine Kelly Vidal
*Director of the United States Patent and Trademark Office*